(12) United States Patent
Kim et al.

(10) Patent No.: US 10,038,028 B2
(45) Date of Patent: Jul. 31, 2018

(54) IMAGE SENSOR INCLUDING DEPLETION INDUCING LAYER

(71) Applicant: SK hynix Inc., Gyeonggi-do (KR)

(72) Inventors: Do-Hwan Kim, Chungcheongbuk-do (KR); Seung-Hoon Sa, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 5 days.

(21) Appl. No.: 15/479,793

(22) Filed: Apr. 5, 2017

(65) Prior Publication Data

US 2018/0090534 A1    Mar. 29, 2018

(30) Foreign Application Priority Data

Sep. 29, 2016 (KR) .................. 10-2016-0125506

(51) Int. Cl.
*H01L 27/00* (2006.01)
*H01L 27/146* (2006.01)

(52) U.S. Cl.
CPC .... *H01L 27/14643* (2013.01); *H01L 27/1461* (2013.01); *H01L 27/14605* (2013.01); *H01L 27/14612* (2013.01); *H01L 27/14623* (2013.01); *H01L 27/14636* (2013.01); *H01L 27/14685* (2013.01); *H01L 27/14689* (2013.01)

(58) Field of Classification Search
CPC ............... H01F 10/324; H01F 10/3281; H05B 2203/023
See application file for complete search history.

(56) References Cited

U.S. PATENT DOCUMENTS

| 9,129,872 | B2 | 9/2015 | Yi et al. | |
| 2016/0013328 | A1* | 1/2016 | Tashiro | ............... H01L 31/0232 |
| | | | | 250/208.1 |
| 2016/0329407 | A1* | 11/2016 | Takemura | ........... H01L 29/0847 |

FOREIGN PATENT DOCUMENTS

| KR | 1020000003345 | 1/2000 |
| KR | 1020070025573 | 3/2007 |

* cited by examiner

*Primary Examiner* — Julio J Maldonado
*Assistant Examiner* — Andre' C Stevenson
(74) *Attorney, Agent, or Firm* — IP & T Group LLP

(57) ABSTRACT

An image sensor may include a pixel array where a plurality of unit pixels are arranged in a two dimensional matrix, wherein each of the unit pixels includes: a substrate including a photoelectric conversion element; one or more depletion inducing layers formed in the photoelectric conversion element; an inter-layer dielectric layer formed over the substrate; and one or more floating electrodes formed in the inter-layer dielectric layer to overlap each of the depletion inducing layers.

20 Claims, 8 Drawing Sheets

IMAGE SENSOR INCLUDING DEPLETION INDUCING LAYER

CROSS-REFERENCE TO RELATED APPLICATIONS

This U.S. non-provisional patent application claims priority under 35 U.S.C. § 119(a) to Korean Patent Application No. 10-2016-0125506, filed on Sep. 29, 2016, in the Korean Intellectual Property Office (KIPO), the disclosure of which is herein incorporated by reference in its entirety.

BACKGROUND

Exemplary embodiments of the present invention relate generally to semiconductor device fabrication technology, and more particularly, to an image sensor and a method for fabricating the same.

An image sensor converts an optical image into an electrical signal. Recent developments in the computer and communication industries have increased demand for an image sensor with improved performance for various devices, such as digital cameras, camcorders, Personal Communication System (PCS), game machines, security cameras, medical micro-cameras, and robots.

SUMMARY

Various embodiments of the present invention are directed to an image sensor having improved performance and a method for fabricating the image sensor.

In an exemplary embodiment, an image sensor may include: a pixel array where a plurality of unit pixels are arranged in a two dimensional matrix, wherein each of the unit pixels includes: a substrate including a photoelectric conversion element; one or more depletion inducing layers formed in the photoelectric conversion element; an inter-layer dielectric layer formed over the substrate; and one or more floating electrodes formed in the inter-layer dielectric layer to overlap each of the depletion inducing layers.

The image sensor may further include: one or more trenches formed in the inter-layer dielectric layer to overlap each of the depletion inducing layers, wherein the floating electrodes are buried in the trenches.

The photoelectric conversion element may include: a first impurity region having first conductivity; and a second impurity region having second conductivity which is complementary to the first conductivity and overlapping the first impurity region in a vertical direction and having a greater thickness than the first impurity region, wherein each of the depletion inducing layers is disposed in the second impurity region. Each of the depletion inducing layers may include an impurity region having the first conductivity which is complementary to the second impurity region. Each of the depletion inducing layers may be disposed in a center of the second impurity region in a vertical direction.

Each of the depletion inducing layers may have a pillar shape of a planar shape selected from the group consisting of a polygon equal to or greater than triangle, a circle, an oval, a polygon ring equal to or greater than a triangle ring, a circle ring, and an oval ring. The inter-layer dielectric layer may include a first dielectric layer over the substrate and a second dielectric layer over the first dielectric layer, and each of the floating electrodes may be disposed in the first dielectric layer. Each of the floating electrodes may have the same planar shape to each of the depletion inducing layers. A line width of each of the floating electrodes may be the same to or smaller than a line width of each of the depletion inducing layers.

In an exemplary embodiment, an image sensor may include: a pixel array where a plurality of unit pixels are arranged in a two dimensional matrix, wherein each of the unit pixels includes: a substrate including a photoelectric conversion element; one or more depletion inducing layers formed in the photoelectric conversion element; an inter-layer dielectric layer formed over the substrate; and a floating electrode formed in the inter-layer dielectric layer and including a first electrode and one or more second electrodes coupled to a bottom of the first electrode to overlap each of the depletion inducing layers.

The inter-layer dielectric layer may have a multiple structure where a first dielectric layer, a second dielectric layer and a third dielectric layer are sequentially stacked, and may further include: a first trench formed in the second dielectric layer; and one or more second trenches formed in the first dielectric layer and having an entrance portion coupled to a bottom of the first trench and overlapping each of the depletion inducing layers, wherein the first electrode and the second electrode are buried in the first trench and the second trenches, respectively.

The image sensor may further include: an anti-reflection layer interposed between the first dielectric layer and the second dielectric layer. The first trench may have a smaller height than the second trench. The first trench may have a greater line width than the second trench.

The photoelectric conversion element may include: a first impurity region having first conductivity; and a second impurity region having second conductivity which is complementary to the first conductivity and overlapping the first impurity region in a vertical direction and having a greater thickness than the first impurity region, wherein each of the depletion inducing layers is disposed in the second impurity region. Each of the depletion inducing layers may include an impurity region having conductivity which is complementary to the second impurity region. Each of the depletion inducing layers may be disposed in a center of the second impurity region in a vertical direction.

The first electrode may have an area corresponding to the photoelectric conversion element or a greater area. Each of the depletion inducing layers may have a pillar shape of a planar shape selected from the group consisting of a polygon equal to or greater than triangle, a circle, an oval, a polygon ring equal to or greater than a triangle ring, a circle ring, and an oval ring. Each of the second electrodes may have the same planar shape to each of the depletion inducing layers. A line width of each of the second electrodes may be the same to or smaller than a line width of each of the depletion inducing layers.

In an exemplary embodiment, a method for fabricating an image sensor may include: forming a dielectric layer over a substrate including a photoelectric conversion element; forming a trench overlapping the photoelectric conversion element in the dielectric layer; forming a depletion inducing layer by ion-Implanting an impurity into the photoelectric conversion element using the dielectric layer where the trench is formed, as an ion-implantation barrier; and forming a floating electrode overlapping the depletion inducing layer by burying a conductive material in the trench.

The photoelectric conversion element may include: a first impurity region having first conductivity; and a second impurity region having second conductivity which is complementary to the first conductivity and overlapping the first impurity region in a vertical direction and having a greater thickness than the first impurity region. The depletion inducing layer may be formed to have conductivity which is complementary to the second impurity region. The depletion inducing layer may be formed in the second impurity region. The depletion inducing layer may be formed to be disposed in a center of the second impurity region in a vertical direction.

The trench, the depletion inducing layer and the floating electrode may have the same planar shape. The depletion inducing layer may have a pillar shape of a planar shape selected from the group consisting of a polygon equal to or greater than triangle, a circle, and oval, a polygon ring equal to or greater than triangle ring, a circle ring, and an oval ring. A line width of the floating electrode may be the same to or smaller than a line width of the depletion inducing layer.

The forming of the floating electrode may include: depositing the conductive material in an over side of the dielectric layer to gap-fill the trench; and performing a planarization process until the dielectric layer is exposed.

The forming of the floating electrode may include: depositing the conductive material in an over side of the dielectric layer to gap-fill the trench; and performing a planarization process until the dielectric layer is exposed.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
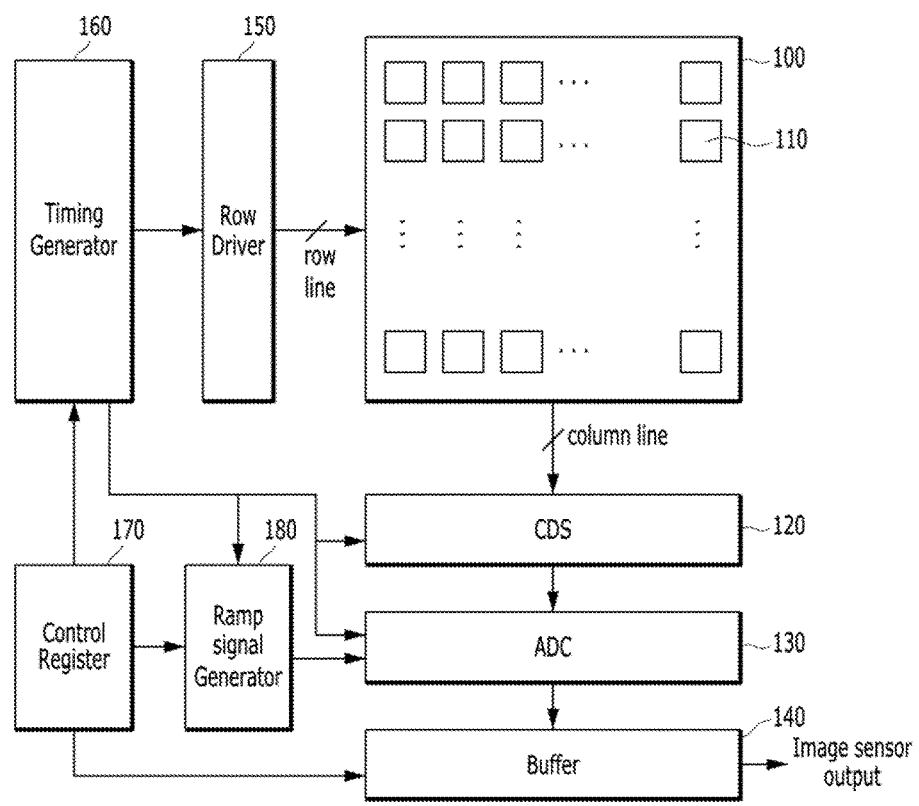
FIG. 1 is a block diagram illustrating an image sensor, in accordance with an exemplary embodiment of the present invention.

Various examples and implementations of the disclosed technology are described below in detail with reference to the accompanying drawings.

The drawings may not necessarily be to scale and in some instances, proportions of structures in the drawings may have been exaggerated to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. Throughout the disclosure, like reference numerals refer to like parts in the various figures and embodiments of the present invention.

In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Furthermore, 'connected/coupled' represents that one component is directly coupled to another component or indirectly coupled through another component. In this specification, a singular form may include a plural form as long as it is not specifically mentioned in a sentence. It will be further understood that the terms "comprises," "comprising," "includes," and "including" when used in this specification, specify the presence of the stated elements and do not preclude the presence or addition of one or more other elements.

Embodiments of the present invention to be described later relate to an image sensor having improved performance and a method for fabricating the same. The image sensor of the present invention has improved performance including being capable of providing an image of a high pixel/high quality. The image sensor is capable of preventing the deterioration of uniformity of pixel characteristics attributable to a shared pixel structure, and a method for fabricating the image sensor.

FIG. 1 is a block diagram illustrating an image sensor in accordance with an exemplary embodiment of the present invention. As illustrated in FIG. 1, the image sensor may include a pixel array 100, a correlated double sampling (CDS) unit 120, an analog-digital converter (ADC) 130, a buffer 140, a row driver 150, a timing generator 160, a control register 170, and a ramp signal generator 180. The pixel array 100 may include a plurality of unit pixel groups 110 arranged in a matrix.

The timing generator 160 may generate one or more control signals for controlling the row driver 150, the CDS unit 120, the ADC 130, and the ramp signal generator 180. The control register 170 may generate one or more control signals for controlling the ramp signal generator 180, the timing generator 160, and the buffer 140.

The row driver 150 may drive the pixel array 100 row by row. For example, the row driver 150 may generate a select signal for selecting any one row line of a plurality of row lines. Each of the unit pixel groups 110 may sense incident light and output an image reset signal and an image signal to the CDS unit 120 through a column line. The CDS unit 120 may perform sampling in response to the image reset signal and the image signal.

The ADC 130 may compare a ramp signal outputted from the ramp signal generator 180 with a sampling signal outputted from the CDS unit 120, and output a comparison signal. According to a clock signal provided from the timing generator 160, the ADC 130 may count the level transition time of the comparison signal, and output the count value to the buffer 140. The ramp signal generator 180 may operate under control of the timing generator 160.

The buffer 140 may store a plurality of digital signals outputted from the ADC 130 and then sense and amplify the digital signals. The buffer 140 may include a memory (not illustrated) and a sense amplifier (not illustrated). The memory may store count values. The count values may represent signals outputted from the plurality of unit pixel groups 110. The sense amplifier may sense and amplify the count values outputted from the memory.

Generally, to provide a high-pixel image, the number of pixels integrated in the pixel array 100 may be increased by arranging a larger number of pixels in a given area. This may be accomplished by decreasing the physical size of each pixel. However, as the physical size of each pixel is reduced, the area occupied by the photoelectric conversion element of each pixel is also reduced which makes it gradually more difficult to realize a high-quality image. The present invention overcomes this limitation of existing image sensors. Specifically, the present invention secures an increased fill factor in a reduced pixel size, by employing a plurality of unit pixel groups 110 wherein each unit pixel group 110 has a shared pixel structure. However, as the shared pixel structure is applied to each of unit pixel groups, the number of power routing paths increases and a power voltage supply mismatch caused by non-uniformity of line resistance occurs. Consequently, a variation in the characteristics of the pixels increases.

Hence, various embodiments of the present invention are directed to an image sensor capable of realizing a high-quality image and having pixels with uniform characteristics by reducing a variation in the characteristics of each of the pixels, and a method for fabricating the image sensor.

Figure 2:
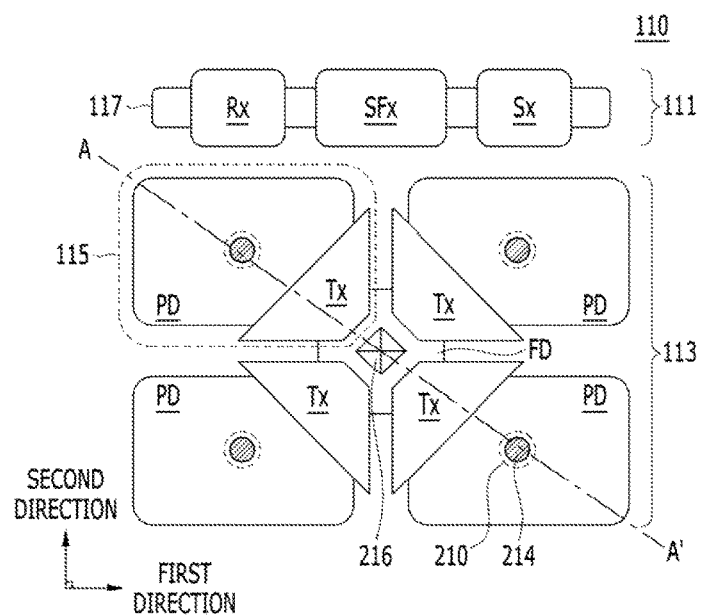
FIG. 2 is a plane view illustrating a unit pixel group of a pixel array of an image sensor, in accordance with an exemplary embodiment of the present invention.
Figure 3:
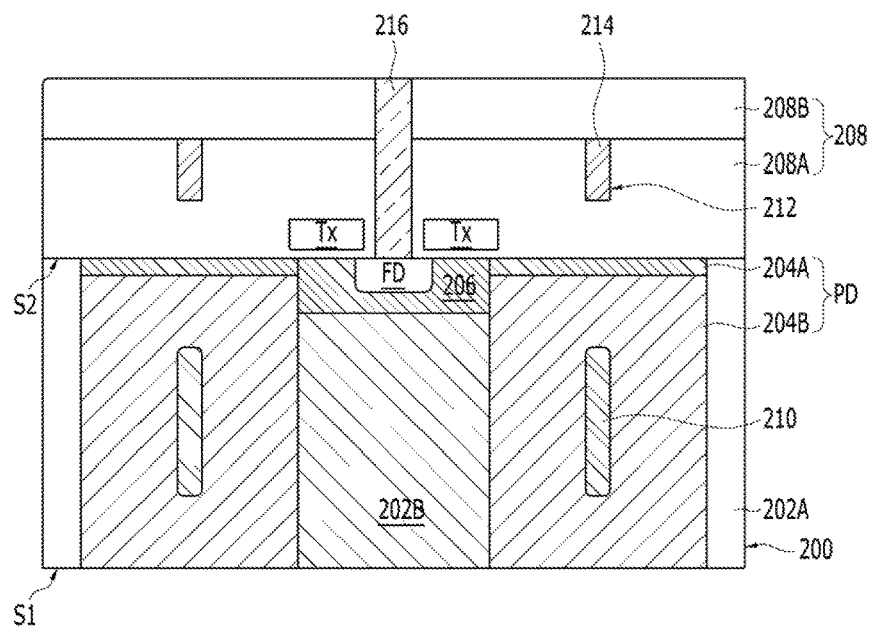
FIG. 3 is a cross-sectional view of the image sensor of FIG. 2.

FIG. 2 is a plane view illustrating a unit pixel group of the pixel array of the image sensor in accordance with an exemplary embodiment of the present invention. FIG. 3 is a cross-sectional view of the image sensor taken along the line A-A' shown in FIG. 2.

As shown in FIG. 2, an image sensor may include the pixel array in which the unit pixel groups 110 or a plurality of unit pixels are arranged in a two dimensional matrix. Each of the unit pixel groups 110 may include a light receiving block 113 for generating a photocharge in response to incident light and an output block 111 for outputting an image signal corresponding to the photocharge generated from the light receiving block 113. The output block 111 may be disposed on one side of the light receiving block 113. Although it is described in the embodiment of the present invention that the unit pixel group 110 is formed of one light receiving block 113 and one output block 111, the unit pixel group 110 may be formed of a plurality of light receiving blocks 113 and one output block 111. In other words, the unit pixel group 110 may be formed to have a plurality of light receiving block 113 sharing one output block 111.

The light receiving block 113 may include a floating diffusion FD and two or more light receiving units 115 sharing one floating diffusion FD. Each of the light receiving units 115 may be understood as a unit pixel. Therefore, each of the light receiving units 115 may include a photoelectric conversion element PD and a transfer transistor. The photoelectric conversion element PD may generate a photocharge in response to incident light. The transfer transistor may transfer the generated photocharge to the floating diffusion FD in response to a transfer signal. The transfer transistor may include a transfer gate Tx. The photoelectric conversion element PD and the floating diffusion FD may serve as a source and a drain of the transfer transistor, respectively. The transfer signal may be applied to the transfer gate Tx. In the illustrated embodiment of FIG. 2 four light receiving units 115 share a single floating diffusion FD with the four light receiving units 115 arranged in a shape surrounding the floating diffusion FD.

The output block 111 may output the image signal to a column line of the pixel array 100 to which the unit pixel group 110 is coupled (see FIG. 1) in response to a selection signal applied through a row line (see FIG. 1). The output block 111 may include a reset transistor, a source follower transistor, and a selection transistor. The reset transistor, the source follower transistor and the selection transistor may share a single active region 117 and include a reset gate Rx, a source follower gate SFx and a selection gate Sx, respectively. The source follower gate SFx may be disposed in the center of the active region 117 and the reset gate Rx and selection gate Sx may be disposed on either side of the source follower gate SFx, respectively, in a first direction (e.g., a row direction). The active region 117 as viewed in the plan view of FIG. 2 may have the shape of an elongated member extending in the first direction along one side of the light receiving block 113.

As shown in FIG. 3, an image sensor may include a substrate 200, a depletion inducing layer 210, an inter-layer dielectric layer 208, and a floating electrode 214. The substrate 200 may include the photoelectric conversion element PD. The depletion inducing layer 210 may be formed in the photoelectric conversion element PD. The inter-layer dielectric layer 208 may be formed over the substrate 200 and the photoelectric conversion element PD. The floating electrode 214 may be formed in the inter-layer dielectric layer 208 to overlap the depletion inducing layer 210. The image sensor may include a trench 212 formed in the inter-layer dielectric layer 208 to overlap the depletion inducing layer 210. The floating electrode 214 may be formed in the trench 212. In other words, the floating electrode 214 may be buried in the trench 212.

Hereinafter, the constituent elements of the image sensor in accordance with the embodiment are described in detail.

The image sensor may include the photoelectric conversion element PD, an isolation structure 202A and 202B, and the substrate 200. The isolation structure 202A and 202B may include a first isolation structure 202A and a second isolation structure 202B. The first isolation structure 202A may isolate neighboring light receiving blocks 113 from one another. The second isolation structure 202B may isolate neighboring photoelectric conversion elements PD in a light receiving block 113 from one another. The substrate 200 may include a well 206 formed over the second isolation structure 202B so that the top surface of the well 206 may be at the same level as the top surface of the neighboring photoelectric conversion elements PD. The floating diffusion FD may be disposed in the well 206 at a central location of the well 206 with the top surface of the floating diffusion FD at the same level as the top surface of the well region. Each of the transfer gates Tx may be disposed on the well 206 and may partially overlap with the floating diffusion FD and one of the neighboring photoelectric conversion elements PD.

The substrate 200 may have a first side S1 and a second side S2 facing the first side S1. For example, the first side S1 may be a front side of the substrate 200 and the second side S2 may be an over side of the substrate 200. The first side S1 may be an incident side where incident light flows in the photoelectric conversion element PD. The substrate 200 may include a semiconductor substrate. The semiconductor substrate may be of a single crystal state and include a silicon-containing material. That is, the substrate 200 may include a single crystal silicon-containing material. The substrate 200 may be a thin-film substrate formed through a thinning process. For example, the substrate 200 may be a silicon epitaxial layer or a bulk silicon substrate thin-filmed through the thinning process.

The isolation structure 202A and 202B may include a shallow trench isolation (STI), a deep trench isolation (DTI) or a potential barrier. The potential barrier may include an impurity region formed by implanting an impurity into the substrate 200. For example, the potential barrier may be a P-typed impurity region formed by implanting boron, which is a P-typed impurity, into the substrate 200. The isolation structure 202A and 202B may be formed of one of the STI, the DTI and the potential barrier or a combination thereof. The first isolation structure 202A may be formed of the DTI, the potential barrier or a combination thereof. The second isolation structure 202B may be the potential barrier. It is assumed as an example in the embodiment of the present invention that the first isolation structure 202A is the DTI and the second isolation structure 202B is the potential barrier, namely, the P-typed impurity region.

The photoelectric conversion element PD may include an organic or inorganic photodiode. For example, the photoelectric conversion element PD may have a structure in which a first impurity region 204A and a second impurity region 204B are stacked in a vertical direction. The first impurity region 204A and the second impurity region 204B may be formed in the substrate 200 and have complementary conductive types. The first impurity region 204A may be substantially thin relatively to the second impurity region 204B. The first impurity region 204A and the second impurity region 204B may be formed by implanting a predefined impurity into the substrate 200. To be specific, the first impurity region 204A may be the P-typed impurity region and the second impurity region 204B may be an N-typed impurity region. The first impurity region 204A may be in contact with the second side S2 of the substrate 200 and the second impurity region 204B may be in contact with the first side S1 of the substrate 200. The interface between the first impurity region 204A and the second impurity region 204B may be adjacent to the second side S2 of the substrate 200.

In an exemplary embodiment of the present invention, the photoelectric conversion element PD may include a P-type semiconductor pattern (not illustrated) on the second impurity region 204B. The second impurity region 204B may be disposed between the first impurity region 204A and the P-type semiconductor pattern (not illustrated). In an exemplary embodiment, the first impurity region 204A may be omitted.

The well 206 formed over the isolation structure 202B between a plurality of photoelectric conversion elements PD surrounding the floating diffusion FD may offer a space where the floating diffusion FD is formed and a channel of the transfer transistor and have P-typed conductivity. When the second isolation structure 202B is the potential barrier, i.e., the P-typed impurity region, the well 206 may have the same conductivity to the second isolation structure 202B and have a greater impurity doping concentration than the second isolation structure 202B. The floating diffusion FD formed in the well 206 may include an impurity region having a complementary conductive type to the well 206. For example, the floating diffusion FD may include the N-typed impurity region. Although it is described in the embodiment of the present invention that the well 206 is formed just in the region where the floating diffusion FD is disposed, the well 206 may be formed over the first isolation structure 202A where the floating diffusion FD is not formed when the first isolation structure 202A is the potential barrier, i.e., the P-typed impurity region.

The image sensor in accordance with the embodiment of the present invention may include the depletion inducing layer 210 formed in the photoelectric conversion element PD. As the degree of integration of the image sensor increases, an area capable of forming the photoelectric conversion element PD decreases. For this reason, it is difficult to realize a high-quality image. In order to realize a high-quality image, full well capacitance (FWC) required for the device has to be secured and to this end, an impurity doping concentration on the second impurity region 204B of the photoelectric conversion element PD has to be increased. The first impurity region 204A and structures having the same conductive type to the first impurity region 204A for pinning of the second impurity region 204B may be formed on the exterior of the second impurity region 204B. When the impurity doping concentration of the second impurity region 204B is increased in order to secure the full well capacitance, the sensitivity of the image sensor may be degraded because it is not possible to fully deplete the second impurity region 204B. To prevent this problem, the image sensor in the embodiment of the present invention may form the depletion inducing layer 210 in the photoelectric conversion element PD, thereby easily realizing the full depletion of the photoelectric conversion element PD.

In order to realize the full depletion of the photoelectric conversion element PD on the second impurity region 204B, the depletion inducing layer 210 may include an impurity region having a complementary conductive type to the second impurity region 204B. In other words, the depletion inducing layer 210 may include the P-typed impurity region. The depletion inducing layer 210 may be disposed in the second impurity region 204B and disposed in the center of the second impurity region 204B in a vertical direction. The depletion inducing layer 210 may have a pillar shape extending in the vertical direction and a planar shape of a polygon equal to or greater than triangle (i.e. triangle, rectangle, polygon, etc.), a circle, or an oval. Since the depletion inducing layer 210 forms the depletion region in the second impurity region 204B, the second impurity region 204B may be fully depleted. Accordingly, the full well capacitance may be secured and the sensitivity of the image sensor may be improved.

The image sensor in accordance with the embodiment of the present invention may include the inter-layer dielectric layer 208 formed over the substrate 200, the trench 212 formed in the inter-layer dielectric layer 208, and the floating electrode 214 buried in the trench 212.

The Inter-layer dielectric layer 208 which is formed over the substrate 200 may include a first dielectric layer 208A and a second dielectric layer 208B. The first dielectric layer 208A and the second dielectric layer 208B may include the same material. Each of the first dielectric layer 208A and the second dielectric layer 208B may include a layer selected from the group consisting of an oxide layer, a nitride layer, an oxynitride layer, and combinations thereof.

The trench 212 where the floating electrode 214 is buried may be formed in the first dielectric layer 208A included in the inter-layer dielectric layer 208. The bottom of the trench 212 may have a higher level than the interface between the first dielectric layer 208A and the substrate 200. This is for preventing the floating electrode 214 from being electrically coupled to the photoelectric conversion element PD and controlling a capacity of a coupling capacitor attributable to the floating electrode 214. The trench 212 may have the same planar shape to the depletion inducing layer 210. For example, the trench 212 may have a planar shape of a polygon equal to or greater than triangle, a circle, or an oval. The trench 212 may have the same or a smaller line width to or than the depletion inducing layer 210. This is because the first dielectric layer 208A where the trench 212 is formed may be used as an ion-implantation barrier in a depletion inducing layer 210 fabrication process.

The floating electrode 214 may reduce a variation in the characteristics of the pixels. To be specific, the floating electrode 214 may reduce the variation in the characteristics of the pixels by forming a coupling capacitor with a neighboring structure. The coupling capacitor attributable to the floating electrode 214 may compensate for a mismatch of a power source supply occurring because power routing paths are different for each pixel, that is, a difference between supply voltages based on dispositions of pixels in the pixel array so that the variation in the characteristics of the pixels may be reduced. Accordingly, a disposition of the floating electrode 214 may be different in each of the pixels based on the dispositions of the pixels in the pixel array.

The image sensor in accordance with an embodiment of the present invention may include a contact plug 216 coupled to the floating diffusion FD by penetrating the inter-layer dielectric layer 208. The contact plug 216 may have a polygon, a rectangle, a triangle, a circle, or an oval cross section, and may be an elongated vertical member extending in the vertical direction which is perpendicular to the plane defined by the first and second directions. The transfer gates Tx may not contact the contact plug 216. In addition, although not illustrated in the drawings, the image sensor may include lines formed over the inter-layer dielectric layer 208. For example, the lines coupled to the contact plug 216 may be formed to couple the floating diffusion FD to a source follower gate SFx over the inter-layer dielectric layer 208.

Although not illustrated in the drawings, the image sensor in accordance with an embodiment of the present invention may include a color separation element formed over the first side S1 of the substrate 200 and a light focusing element formed over the color separation element. The color separation element may include a color filter. The color filter may include a red filter, green filter, a blue filter, a cyan filter, a yellow filter, a magenta filter, a white filter, a black filter, an IR cutoff filter and the like. The light focusing element may include a digital lens or a hemispherical lens.

By including the depletion inducing layer 210 in the photoelectric conversion element PD of the image sensor, as described above, full depletion of the photoelectric conversion element PD may be realized. Consequently, the full well capacitance may be secured and the sensitivity of the image sensor may be improved.

In addition, including the floating electrodes 214 in the image sensor as described above, the variation in the characteristics of the pixels may be reduced.

Although it is described in the embodiment of the present invention that the floating electrode 214 is buried in the trench 212, an insulating material instead of a conductive material may be buried in the trench 212. For example, the second dielectric layer 208B may be buried in the trench 212.

Figure 4:
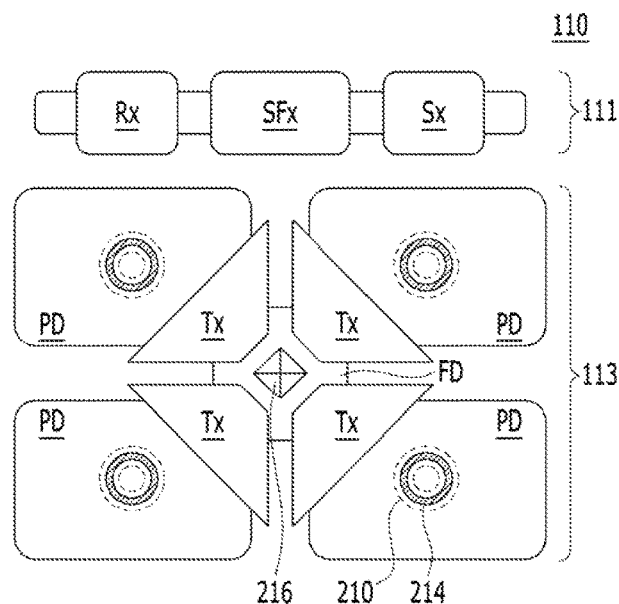
FIGS. 4 and 5 are plane views illustrating an image sensor, in accordance with another exemplary embodiment of the present invention.
Figure 5:
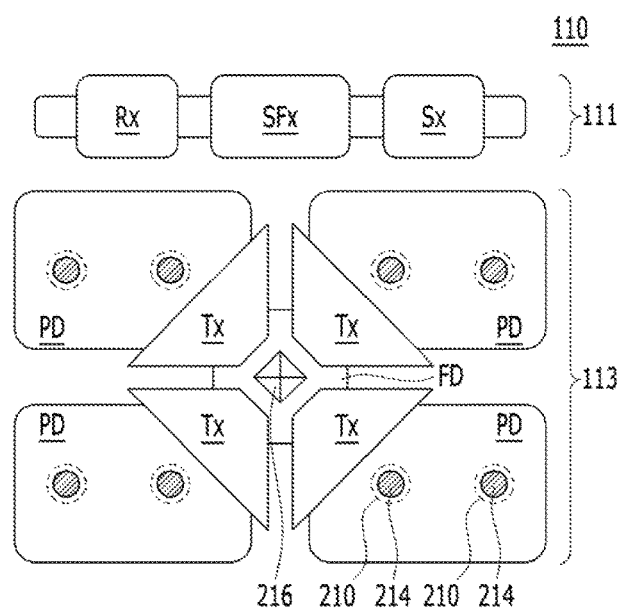

FIGS. 4 and 5 are plane views illustrating an image sensor in accordance with another embodiment of the present invention. For the sake of convenience in description, the following embodiment of the image sensor uses the same reference numerals appearing in FIGS. 1 to 3.

As shown in FIG. 4, an image sensor in accordance with another embodiment may include a depletion inducing layer 210 formed in a photoelectric conversion element PD, wherein the depletion inducing layer 210 may have a ring planar shape. Such shape may further enhance full depletion. For example, the depletion inducing layer 210 may include a ring shape selected from the group consisting of a polygon ring equal to or greater than a triangle ring, a circle ring, or an oval ring. The ring-typed depletion inducing layer 210 may more easily realize the full depletion by increasing an area which comes in contact with a second impurity region 204B of the photoelectric conversion element PD. In an exemplary embodiment of the present invention, the depletion inducing layer 210 and/or the floating electrode 214 may be of a cylinder type.

As shown in FIG. 5, the image sensor in accordance with yet another embodiment may include a plurality of depletion inducing layers 210 formed in a photoelectric conversion element PD and a plurality of floating electrodes 214 overlapping each of the depletion inducing layers 210. The number of the depletion inducing layers 210 and the floating electrodes 214 may be controlled based on desired characteristics. Although it is described in the embodiment of FIG. 5 that the depletion inducing layers 210 have the same planar shape, they may also have different planar shapes according to other embodiments.

Figure 6:
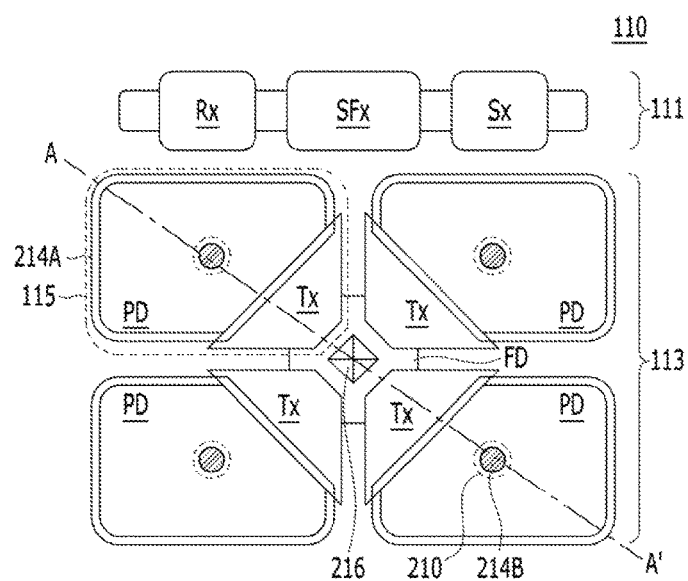
FIG. 6 is a plane view illustrating a unit pixel group of a pixel array of an image sensor, in accordance with an exemplary embodiment of the present invention.
Figure 7:
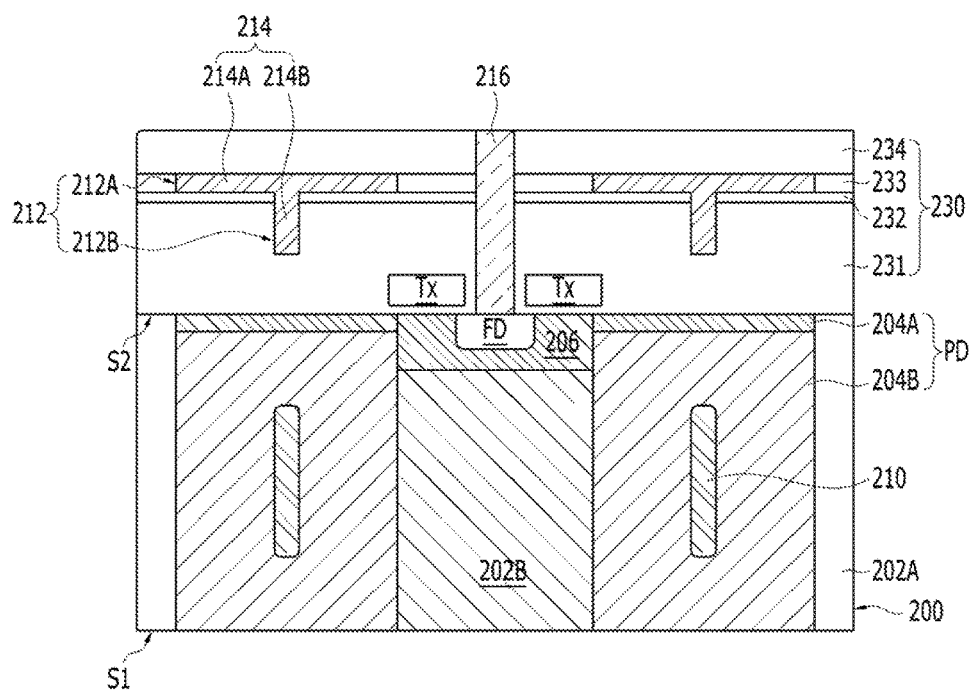
FIG. 7 is a cross-sectional view of the image sensor of FIG. 6.

FIG. 6 is a plane view illustrating a unit pixel group of a pixel array of an image sensor in accordance with an exemplary embodiment of the present invention. FIG. 7 is a cross-sectional view of the image sensor taken along the line A-A' shown in FIG. 6. For the sake of convenience in description, the following embodiment of the image sensor uses the same reference numerals appearing in FIGS. 1 to 3.

As shown in FIGS. 6 and 7, the image sensor in accordance with an embodiment of the present invention may include a substrate 200, one or more depletion inducing layers 210, an inter-layer dielectric layer 230, and one or more floating electrodes 214. The substrate 200 may include a photoelectric conversion element PD. The depletion inducing layers 210 may be formed in the photoelectric conversion element PD. The inter-layer dielectric layer 230 may be formed over the substrate 200. The floating electrodes 214 may be formed in the inter-layer dielectric layer 230 to overlap each of the depletion inducing layers 210. In addition, the image sensor may include one or more trenches 212 formed in the inter-layer dielectric layer 230 to overlap each of the depletion inducing layers 210. The floating electrodes 214 may be formed in the trenches 212. In other words, the floating electrodes 214 may be buried in the trenches 212.

Hereinafter, the constituent elements of the image sensor in accordance with the embodiment are described in detail, focusing on those contrasted with the exemplary embodiments of the present invention described above.

The image sensor may include the inter-layer dielectric layer 230 formed over the substrate 200, the trenches 212 formed in the inter-layer dielectric layer 230, and the floating electrodes 214 buried in the trenches 212.

The inter-layer dielectric layer 230 formed over the substrate 200 may include a first dielectric layer 231, an anti-reflection layer 232, a second dielectric layer 233, and a third dielectric layer 234, which are sequentially stacked. The anti-reflection layer 232 may be used as an etch stop layer in a trench 212 fabrication process. The first dielectric layer 231, the anti-reflection layer 232, the second dielectric layer 233 and the third dielectric layer 234 may include a single layer selected from the group consisting of an oxide, a nitride and an oxynitride, or a multi-layer thereof.

Each of the trenches 212 formed in the inter-layer dielectric layer 230 may include a first trench 212A and a second trench 212B whose entrance portion is coupled to the bottom of the first trench 212A. The first trench 212A may be formed in the second dielectric layer 233 and the second trench 212B may be formed in the anti-reflection layer 232 and the first dielectric layer 231. The bottom of the first trench 212A may be in contact with the anti-reflection layer 232 and the bottom of the second trench 212B may have a higher level than the interface between the first dielectric layer 231 and the substrate 200. This configuration may prevent the floating electrodes 214 from being electrically coupled to the photoelectric conversion element PD and control a capacity of a coupling capacitor attributable to the floating electrodes 214.

Each of light receiving units 115, i.e., each of the pixels may include one first trench 212A and one or more second trenches 212B may be coupled to the first trench 212A. The first trench 212A may have a smaller thickness or height than the second trench 212B and the first trench 212A may have a greater line width or area than the second trench 212B. The thicknesses and line widths or areas of the first trench 212A and second trench 212B may be selected for controlling a volume of the floating electrode 214 buried therein. That is, the thicknesses and line widths or areas of the first trench 212A and second trench 212B may be selected for preventing supernumerary capacitance from occurring. For example, the first trench 212A may have an area corresponding to the photoelectric conversion element PD or a greater area. In the embodiment of the present invention, a case where the first trench 212A has a greater area than the photoelectric conversion element PD is described. The second trench 212B may have the same planar shape to the depletion inducing layer 210. For example, the second trench 212B may have a single planar shape selected from the group consisting of a polygon equal to or greater than triangle, a circle, an oval, a polygon ring equal to or greater than a triangle ring, a circle ring, and an oval ring. This is because the anti-reflection layer 232 where the second trench 212B is formed and the first dielectric layer 231 may be used as an ion-implantation barrier in a depletion inducing layers 210 fabrication process.

The floating electrode 214 may reduce a variation in the characteristics of the pixels. To be specific, the floating electrode 214 may reduce the variation in the characteristics of the pixels by forming a coupling capacitor with a neighboring structure. The coupling capacitor attributable to the floating electrode 214 may compensate for a mismatch of a power source supply occurring because power routing paths are different for each pixel, that is, a difference between supply voltages based on dispositions of pixels in the pixel array so that the variation in the characteristics of the pixels may be reduced. Accordingly, a disposition of the floating electrode 214 may be different in each of the pixels based on the dispositions of the pixels in the pixel array.

The floating electrode 214 may be buried in the trench 212. To be specific, the floating electrode 214 may include a first electrode 214A buried in the first trench 212A and a second electrode 214B buried in the second trench 212B. As the floating electrode 214 has the first electrode 214A and the second electrode 214B, an overlap degree of neighboring structures may be easily controlled. In other words, capacitance of the coupling capacitor using the floating electrode 214 may be easily controlled and the variation in the characteristic of the pixels may be easily reduced. In addition, the first electrode 214A may serve as a front-side reflection layer against incident light flowing in the first dielectric layer 231 by penetrating the photoelectric conversion element PD. Consequently, quantum efficiency of the photoelectric conversion element PD may be improved.

The image sensor in accordance with an embodiment of the present invention may include a contact plug 216 coupled to a floating diffusion FD by penetrating the inter-layer dielectric layer 230. In addition, although not illustrated in the drawings, the image sensor may include lines formed over the inter-layer dielectric layer 230. For example, the lines coupled to the contact plug 216 may be formed to couple the floating diffusion FD to a source follower gate SFx over the inter-layer dielectric layer 230.

Although not illustrated in the drawings, the image sensor in accordance with the embodiment of the present invention may include a color separation element formed over a first side S1 of the substrate 200 and a light focusing element formed over the color separation element.

As the image sensor includes the depletion inducing layer 210 in the photoelectric conversion element PD as described above, the full depletion of the photoelectric conversion element PD may be easily realized. Consequently, the full well capacitance may be secured and the sensitivity of the image sensor may be improved.

In addition, as the image sensor includes the floating electrodes 214, the variation in the characteristics of the pixels may be reduced.

FIGS. 8A to 8F are cross-sectional views of an image sensor for describing a method for fabricating the image sensor in accordance with an exemplary embodiment of the present invention. FIGS. 8A to 8F are cross-sectional views of the image sensor taken along the line A-A' shown in FIG. 2.

Figure 8A:
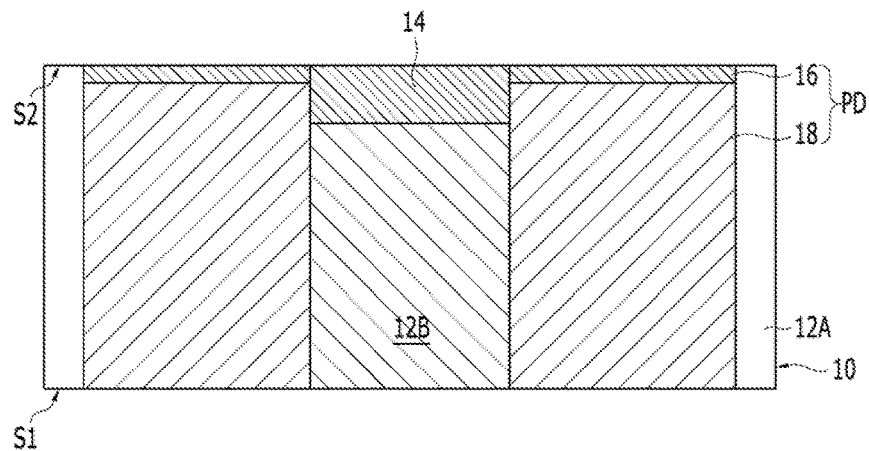
FIGS. 8A to 8F are cross-sectional views of an image sensor for describing a method for fabricating the image sensor, in accordance with an exemplary embodiment of the present invention.

As shown in FIG. 8A, a substrate 10 may be formed. The substrate 10 may have a first side S1 and a second side S2 facing the first side S1. For example, the first side S1 may be a front side of the substrate 10 and the second side S2 may be an over side of the substrate 10. The substrate 10 may include a semiconductor substrate. The semiconductor substrate may be of a single crystal state and include a silicon-containing material. That is, the substrate may include a single crystal silicon-containing material.

A plurality of photoelectric conversion elements PD may be formed in the substrate 10. Each of the photoelectric conversion elements PD may include an organic or inorganic photodiode. For example, the photoelectric conversion element PD may have a structure in which a first impurity region 16 and a second impurity region 18 are stacked in a vertical direction. The first impurity region 16 and the second impurity region 18 may be formed by implanting a predefined impurity into the substrate 10 and have complementary conductive types. The first impurity region 16 may be thinner relatively to the second impurity region 18. The first impurity region 16 may be a P-typed impurity region and the second impurity region 18 may be an N-typed impurity region. The first impurity region 16 may be in contact with the second side S2 of the substrate 10 and the second impurity region 18 may be in contact with the first side S1 of the substrate 10. The first side S1 of the substrate 10 may be an incident side where incident light flows in the photoelectric conversion element PD.

An isolation structure 12 including first and second isolation structures 12A and 12B may be formed. The isolation structure 12B may isolate neighboring photoelectric conversion elements PD in a unit pixel group from one another. The isolation structure 12A may isolate neighboring unit pixel groups from one another. The isolation structure 12 may include a shallow trench isolation (STI), a deep trench isolation (DTI) or a potential barrier. The potential barrier may include an impurity region formed by implanting an impurity into the substrate 10. The isolation structure 12 may be formed of one of the STI, the DTI and the potential barrier or a combination thereof.

A well 14 may be formed on the isolation structure 12B. The well 14 may have P-typed conductivity. When the second isolation structure 12B is the potential barrier, i.e., the P-typed impurity region, the well 14 may have the same conductivity to the second isolation structure 12B and have a greater impurity doping concentration than the second isolation structure 12B.

Figure 8B:
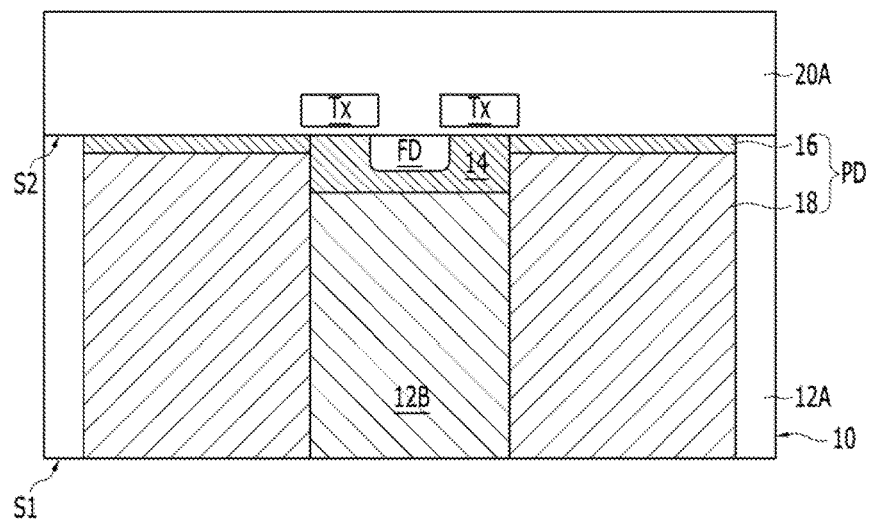

As shown in FIG. 8B, transfer gates Tx may be formed over the second side S2 of the substrate 10 and subsequently, a floating diffusion FD may be formed in the well 14 between the transfer gates Tx. The floating diffusion FD may be formed by ion-implanting an N-typed impurity, e.g., phosphorus (P) or arsenic (As), into the well 14.

A first dielectric layer 20A may be formed over the second side S2 of the substrate 10. The first dielectric layer 20A may serve as an inter-layer dielectric layer and be formed of a single layer selected from the group consisting of an oxide, a nitride and an oxynitride, or a stacked layer thereof.

Figure 8C:
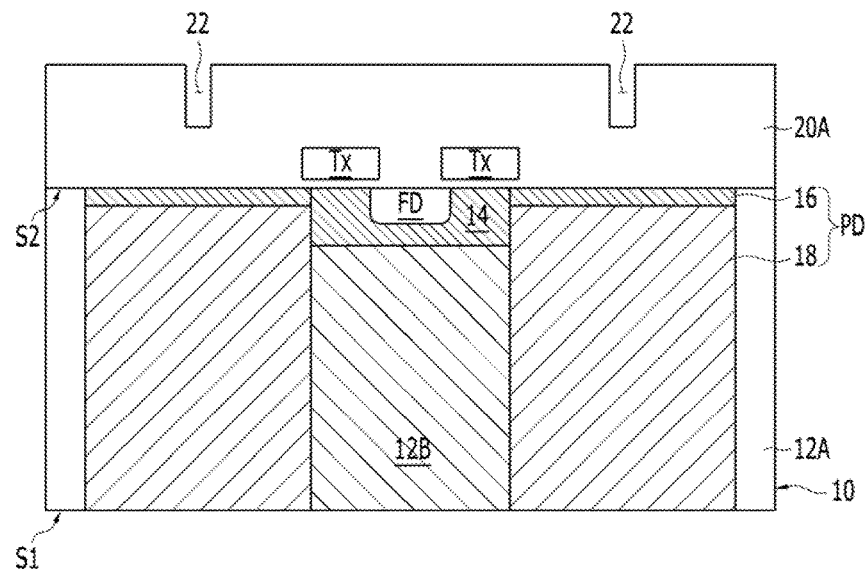

As shown in FIG. 8C, a mask pattern (not illustrated) may be formed over the first dielectric layer 20A and subsequently, a trench 22 may be formed to overlap the photoelectric conversion element PD by etching the first dielectric layer 20A using the mask pattern as an etch barrier. An etch process for forming the trench 22 may include a dry etch process. The bottom of the trench 22 may be formed to be disposed at a higher level than the second side S2 of the substrate 10. The trench 22 may have a single planar shape selected from the group consisting of a polygon equal to or greater than triangle, a circle, an oval, a polygon ring equal to or greater than a triangle ring, a circle ring, and an oval ring.

The mask pattern (not illustrated) for forming the trench 22 may be formed according to any suitable method for forming a fine pattern. The fine pattern may be a nanoscale fine pattern. For example, after a photoresist pattern is formed, the mask pattern may be formed through a series of fabrication processes of forming a spacer on a side wall of the photoresist pattern and reducing a line width of an open portion.

Figure 8D:
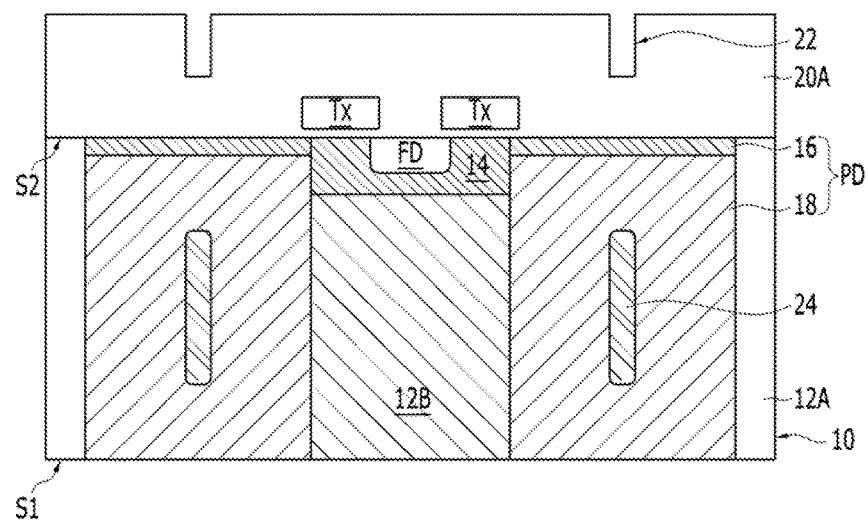

As shown in FIG. 8D, a depletion inducing layer 24 may be formed in the photoelectric conversion element PD by sequentially performing an ion-implantation process and an activation process on the first dielectric layer 20A where the trench 22 is formed as an ion-implantation barrier. Due to a thickness difference of the first dielectric layer 20A attributable to the trench 22, an impurity may be implanted into the photoelectric conversion element PD overlapping the trench 22.

The depletion inducing layer 24 may be formed as an impurity region having a complementary conductivity to the second impurity region 18 of the photoelectric conversion element PD. In other words, the depletion inducing layer 24 may include the P-typed impurity region. The depletion inducing layer 24 may be disposed in the second impurity region 18 and disposed in the center of the second impurity region 18 in a vertical direction by controlling an ion-implantation energy. Further, the depletion inducing layer 24 may be formed to have a pillar shape extending in the vertical direction.

Since the depletion inducing layer 24 is formed using the first dielectric layer 20A where the trench 22 is formed as the ion-implantation barrier, the depletion inducing layer 24 may have the same planar shape to the trench 22. Further, the depletion inducing layer 24 may have the same or a greater line width to or than the trench 22. The reason why the depletion inducing layer 24 has a greater line width than the trench 22 may be diffusion of the impurity in the activation process on the impurity.

As described above, when the depletion inducing layer 24 is formed using the trench 22 for a floating electrode 26 formed through a subsequent process, a fabrication process may be simplified and the depletion inducing layer 24 having a fine line width may be easily formed in the photoelectric conversion element PD whose area is reduced due to an increase in degree of integration.

Figure 8E:
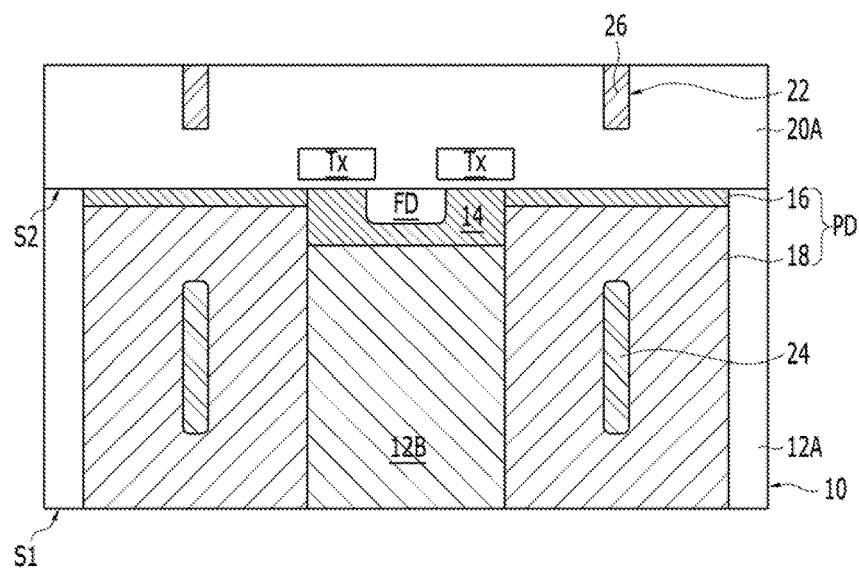

As shown in FIG. 8E, the floating electrode 26 buried in the trench 22 may be formed. The floating electrode 26 may reduce the variation in the characteristics of the pixels. After a conductive material is deposited to gap-fill the trench 22 in the over side of the first dielectric layer 20A including the trench 22, the floating electrode 26 may be formed through a series of fabrication processes of performing a planarization process until the first dielectric layer 20A is exposed. A chemical mechanical polishing (CMP) process may be used for the planarization process.

Consequently, the floating electrode 26 overlapping the depletion inducing layer 24 formed in the photoelectric conversion element PD may be formed.

Figure 8F:
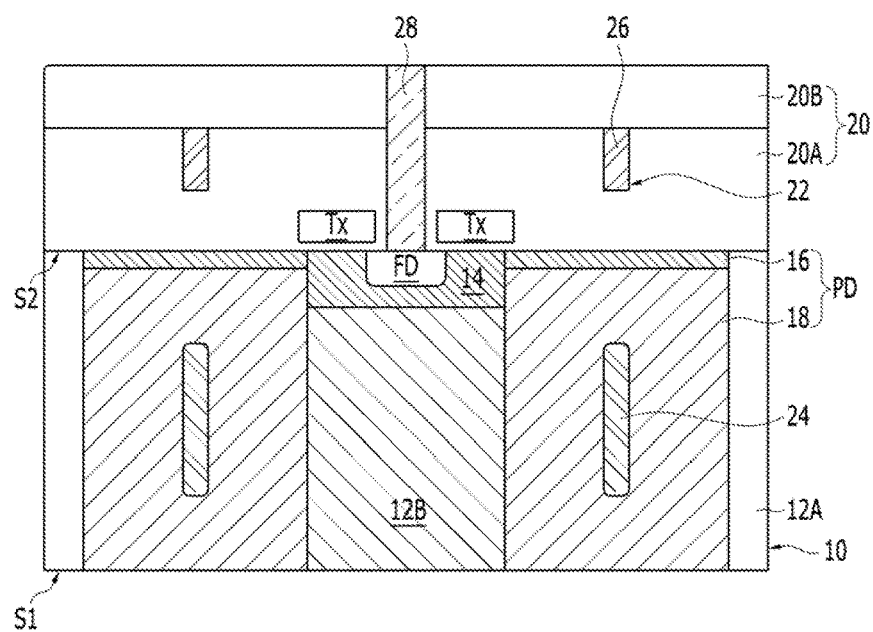

As shown in FIG. 8F, a second dielectric layer 20B may be formed over the first dielectric layer 20A. The second dielectric layer 208 may serve as an inter-layer dielectric layer, just like the first dielectric layer 20A. The second dielectric layer 208 may be a single layer selected from the group consisting of an oxide, a nitride and an oxynitride, or a multi-layer thereof. Hereinafter, a multi-layer where the first dielectric layer 20A and the second dielectric layer 20B are stacked may be referred to as an inter-layer dielectric layer 20.

Subsequently, a contact plug 28 coupled to the floating diffusion FD by penetrating the inter-layer dielectric layer 20 may be formed.

Although not illustrated, lines may be formed over the inter-layer dielectric layer 20. For example, the lines coupled to the contact plug 28 may be formed to couple the floating diffusion FD to a source follower gate SFx over the inter-layer dielectric layer 20.

Subsequently, the image sensor may be completed using any suitable fabrication method.

The image sensor in accordance with an exemplary embodiment of the present invention may be used in various electronic devices or systems. Hereafter, a camera including an image sensor in accordance with an exemplary embodiment of the present invention will be described with reference to FIG. 9.

Figure 9:
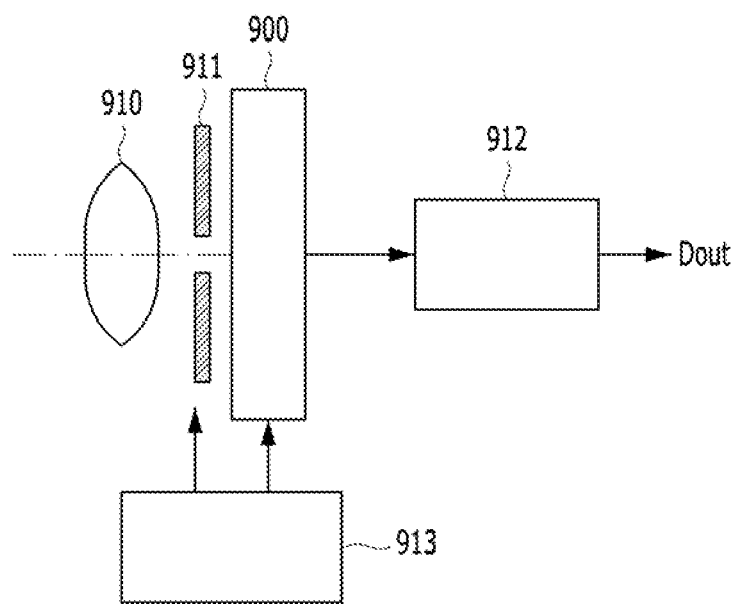
FIG. 9 is a diagram illustrating an electronic device including an image sensor, in accordance with an exemplary embodiment of the present invention.

FIG. 9 is a diagram illustrating an electronic device including an image sensor 900 in accordance with an exemplary embodiment of the present invention. Referring to FIG. 9, the electronic device including the image sensor 900 in accordance with an exemplary embodiment of the present invention may be a camera capable of taking a still image or a moving image. The electronic device may include an optical system or optical lens 910, a shutter unit 911, a driving unit 913 for controlling/driving the image sensor 900 and the shutter unit 911, and a signal processing unit 912.

The optical system 910 may guide incident image light from an object to the pixel array 100 of the image sensor 900. The optical system 910 may include a plurality of optical lenses. The shutter unit 911 may control a light irradiation period and a light shield period for the image sensor 900. The driving unit 913 may control a transmission operation of the image sensor 900 and a shutter operation of the shutter unit 911. The signal processing unit 912 may process signals outputted from the image sensor 900 in various manners. The processed image signals Dout may be stored in a storage medium such as a memory or outputted to a monitor or the like.

According to various embodiments of the present invention, an image sensor is provided which includes a depletion inducing layer that is formed in a photoelectric conversion element, so that full well capacitance may be secured and sensitivity of the image sensor may be improved.

Further, the image sensor may include a floating electrode formed in an inter-layer dielectric layer, the floating electrode overlapping the depletion inducing layer to thereby reduce variation in the characteristics of pixels.

While the present invention has been described with respect to specific embodiments, it should be noted that the embodiments are mere examples for describing, not limiting, the present invention. Further, it should be noted that the present invention may be achieved in various other ways through substitution, change, and modification, by those skilled in the art without departing from the scope of the present invention as defined by the following claims.

What is claimed is:

1. An image sensor, comprising:
   a pixel array where a plurality of unit pixels are arranged in a two dimensional matrix,
   wherein each of the unit pixels includes:
      a substrate including a photoelectric conversion element;
      one or more depletion inducing layers formed in the photoelectric conversion element;
      an inter-layer dielectric layer formed over the substrate; and
      one or more floating electrodes formed in the inter-layer dielectric layer to overlap each of the depletion inducing layers,
   wherein the photoelectric conversion element includes:
      a first impurity region having first conductivity; and
      a second impurity region having second conductivity which is complementary to the first conductivity and overlapping the first impurity region in a vertical direction,
   wherein each of the depletion inducing layers is disposed in the second impurity region,
   wherein each of the depletion inducing layers includes an impurity region having the first conductivity which is complementary to the second impurity region.

2. The image sensor of claim 1, further comprising:
   one or more trenches formed in the inter-layer dielectric layer to overlap each of the depletion inducing layers,
   wherein the floating electrodes are buried in the trenches.

3. The image sensor of claim 1,
   wherein the second impurity region has a greater thickness than the first impurity region.

4. The image sensor of claim 1, wherein each of the depletion inducing layers is disposed in a center of the second impurity region in a vertical direction.

5. The image sensor of claim 1, wherein each of the depletion inducing layers has a pillar shape of a planar shape selected from the group consisting of a polygon equal to or greater than triangle, a circle, an oval, a polygon ring equal to or greater than a triangle ring, a circle ring, and an oval ring.

6. The image sensor of claim 1, wherein the inter-layer dielectric layer includes a first dielectric layer over the substrate and a second dielectric layer over the first dielectric layer, and each of the floating electrodes is disposed in the first dielectric layer.

7. The image sensor of claim 1, wherein each of the floating electrodes has the same planar shape to each of the depletion inducing layers.

8. The image sensor of claim 1, wherein a line width of each of the floating electrodes is the same to or smaller than a line width of each of the depletion inducing layers.

9. An image sensor, comprising:
   a pixel array where a plurality of unit pixels are arranged in a two dimensional matrix,
   wherein each of the unit pixels includes:
      a substrate including a photoelectric conversion element;
      one or more depletion inducing layers formed in the photoelectric conversion element;
      an inter-layer dielectric layer formed over the substrate; and
      a floating electrode formed in the inter-layer dielectric layer and including a first electrode and one or more second electrodes coupled to a bottom of the first electrode to overlap each of the depletion inducing layers.

10. The image sensor of claim 9, wherein the inter-layer dielectric layer has a multiple structure where a first dielectric layer, a second dielectric layer and a third dielectric layer are sequentially stacked, and further comprising:
    a first trench formed in the second dielectric layer; and
    one or more second trenches formed in the first dielectric layer and having an entrance portion coupled to a bottom of the first trench and overlapping each of the depletion inducing layers,
    wherein the first electrode and the second electrode are buried in the first trench and the second trenches, respectively.

11. The image sensor of claim 10, further comprising:
    an anti-reflection layer interposed between the first dielectric layer and the second dielectric layer.

12. The image sensor of claim 10, wherein the first trench has a smaller height than the second trench.

13. The image sensor of claim 10, wherein the first trench has a greater line width than the second trench.

14. The image sensor of claim 9, wherein the photoelectric conversion element includes:
    a first impurity region having first conductivity; and
    a second impurity region having second conductivity which is complementary to the first conductivity and overlapping the first impurity region in a vertical direction and having a greater thickness than the first impurity region,
    wherein each of the depletion inducing layers is disposed in the second impurity region.

15. The image sensor of claim 14, wherein each of the depletion inducing layers includes an impurity region having conductivity which is complementary to the second impurity region.

16. The image sensor of claim 14, wherein each of the depletion inducing layers is disposed in a center of the second impurity region in a vertical direction.

17. The image sensor of claim 9, wherein the first electrode has an area corresponding to the photoelectric conversion element or a greater area.

18. The image sensor of claim 9, wherein each of the depletion inducing layers has a pillar shape of a planar shape selected from the group consisting of a polygon equal to or greater than triangle, a circle, an oval, a polygon ring equal to or greater than a triangle ring, a circle ring, and an oval ring.

19. The image sensor of claim 9, wherein each of the second electrodes has the same planar shape to each of the depletion inducing layers.

20. The image sensor of claim 9, wherein a line width of each of the second electrodes is the same to or smaller than a line width of each of the depletion inducing layers.

* * * * *